(12) United States Patent
Doris et al.

(10) Patent No.: US 7,847,357 B2
(45) Date of Patent: Dec. 7, 2010

(54) HIGH PERFORMANCE CMOS DEVICES COMPRISING GAPPED DUAL STRESSORS WITH DIELECTRIC GAP FILLERS, AND METHODS OF FABRICATING THE SAME

(75) Inventors: Bruce B. Doris, Brewster, NY (US); Thomas W. Dyer, Pleasant Valley, NY (US); David R. Medeiros, Ossining, NY (US); Anna W. Topol, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/556,261

(22) Filed: Sep. 9, 2009

(65) Prior Publication Data

US 2009/0321847 A1    Dec. 31, 2009

Related U.S. Application Data

(62) Division of application No. 11/451,869, filed on Jun. 13, 2006, now Pat. No. 7,598,540.

(51) Int. Cl.
*H01L 27/092* (2006.01)
*H01L 21/31* (2006.01)
*H01L 21/8238* (2006.01)

(52) U.S. Cl. .......... 257/369; 257/E21.24; 257/E21.632; 257/E27.062; 438/199; 438/778

(58) Field of Classification Search ............... 257/369, 257/E21.24, E21.632, E27.062; 438/199, 438/778
See application file for complete search history.

(56) References Cited

U.S. PATENT DOCUMENTS

| 3,777,814 | A | 12/1973 | Gustavson et al. |
| 5,937,323 | A | 8/1999 | Orczyk et al. |
| 6,217,658 | B1 | 4/2001 | Orczyk et al. |

(Continued)

OTHER PUBLICATIONS

Tarraf, A. et al., "Stress Investigation of PECVD Dielectric Layers for Advanced Optical MEMS," J. Micromech. Microeng., 2004, pp. 317-323, vol. 14.

(Continued)

*Primary Examiner*—Eugene Lee
*Assistant Examiner*—Peniel M Gumedzoe
(74) *Attorney, Agent, or Firm*—Scully, Scott, Murphy & Presser, P.C.; Louis J. Percello, Esq.

(57) ABSTRACT

The present invention relates to complementary metal-oxide-semiconductor (CMOS) devices having gapped dual stressors with dielectric gap fillers. Specifically, each CMOS device of the present invention includes at least one n-channel field effect transistor (n-FET) and at least one p-channel field effect transistor (p-FET). A tensilely stressed dielectric layer overlays the n-FET, and a compressively stressed dielectric layer overlays the p-FET. A gap is located between the tensilely and compressively stressed dielectric layers and is filled with a dielectric filler material. In one specific embodiment of the present invention, both the tensilely and compressively stressed dielectric layers are covered by a layer of the dielectric filler material, which is essentially free of stress. In an alternatively embodiment of the present invention, the dielectric filler material is only present in the gap between the tensilely and compressively stressed dielectric layers.

10 Claims, 7 Drawing Sheets

U.S. PATENT DOCUMENTS

| | | |
|---|---|---|
| 6,217,721 B1 | 4/2001 | Xu et al. |
| 7,115,954 B2 | 10/2006 | Shimizu et al. |
| 7,214,629 B1 | 5/2007 | Luo et al. |
| 2003/0040158 A1 | 2/2003 | Saitoh |
| 2003/0181005 A1 | 9/2003 | Hachimine et al. |
| 2004/0104405 A1 | 6/2004 | Huang et al. |
| 2005/0214998 A1 | 9/2005 | Chen et al. |

OTHER PUBLICATIONS

Chinese Patent Application Publication No. CN1449585A dated Oct. 15, 2003, English-language abstract only.

Johns, D. et al., "Analog Integrated Circuit Design", 1997, pp. 101-104, John Wiley & Sons, Inc.

HIGH PERFORMANCE CMOS DEVICES COMPRISING GAPPED DUAL STRESSORS WITH DIELECTRIC GAP FILLERS, AND METHODS OF FABRICATING THE SAME

CROSS REFERENCE TO RELATED APPLICATION

This application is a divisional of U.S. patent application Ser. No. 11/451,869, filed Jun. 13, 2006 the entire content and disclosure of which is incorporated herein by reference.

FIELD OF THE INVENTION

This invention relates to high performance complementary metal-oxide-semiconductor (CMOS) devices having gapped dual stressor structures with dielectric gap fillers. More specifically, the present invention relates to CMOS devices each comprising at least one high performance n-channel field effect transistor (n-FET) that is overlaid by a tensilely stressed dielectric layer and at least one high performance p-channel field effect transistor (p-FET) that is overlaid by a compressively stressed dielectric layer, wherein a gap is located between the tensilely and compressively stressed dielectric layers and is filled with a dielectric filler material.

BACKGROUND OF THE INVENTION

Mechanical stresses within a semiconductor device substrate can be used to modulate device performance. For example, in silicon, hole mobility is enhanced when the film is under compressive stress, while the electron mobility is enhanced when the silicon film is under tensile stress. Therefore, compressive and/or tensile stresses can be advantageously created in the channel regions of a p-FET and/or an n-FET in order to enhance the performance of such devices.

However, the same stress component, either compressive or tensile stress, discriminatively affects the performance of a p-FET and an n-FET. In other words, compressive stress enhances the performance of the p-FET, but adversely impacts the performance of the n-FET, while tensile stress enhances the performance of the n-FET, but adversely impacts the performance of the p-FET. Therefore, p-FET and n-FET require different types of stresses for performance enhancement, which imposes a challenge for concurrent fabrication of high performance p-FET and n-FET devices, due to the difficulty in concurrently applying compressive stress to the p-FET and tensile stress to the n-FET.

One conventional approach for creating desired compressive and tensile stresses in channel regions of p-FET and n-FET devices is to cover the p-FET and the n-FET devices with compressively and tensilely stressed dielectric films, respectively, so that tensile and compressive stresses can be respectively applied to the n-FET and p-FET devices.

However, the tensilely and compressively stressed dielectric films in the conventional CMOS devices are typically patterned by lithography and etching, which are prone to misalignments and may result in significant overlay errors (e.g., in the range of about ±20 nm for the 45 nm node devices). Consequently, the tensilely stressed dielectric layer and the compressively stressed dielectric layer cannot be perfectly aligned with each other at their edges, and the boundary region where the tensilely and compressive stressed dielectric layers meet typically contains either an overlap or a gap between these two layers.

Figure 1A:
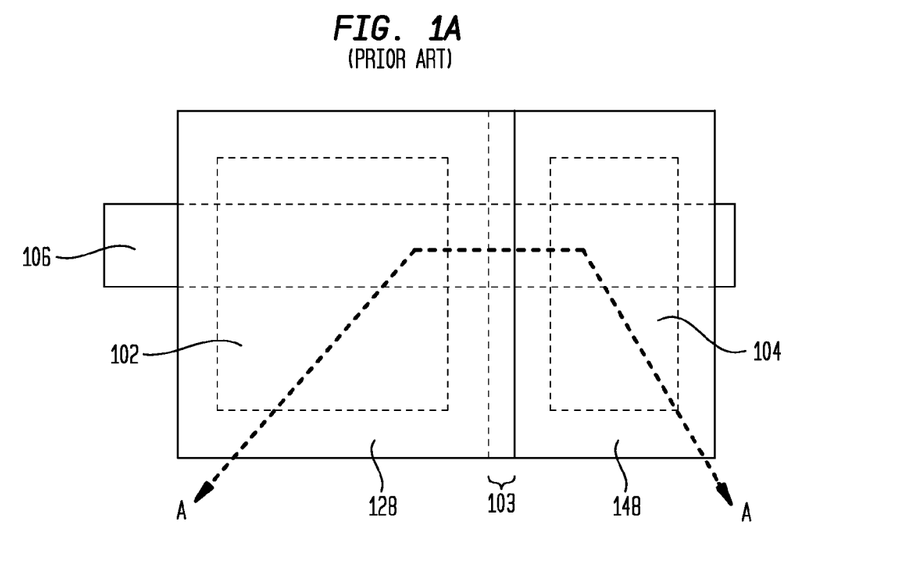
FIG. 1A is a top view of a conventional CMOS device comprising an n-FET and a p-FET with significantly overlapped tensile and compressive stressor layers.
Figure 1B:
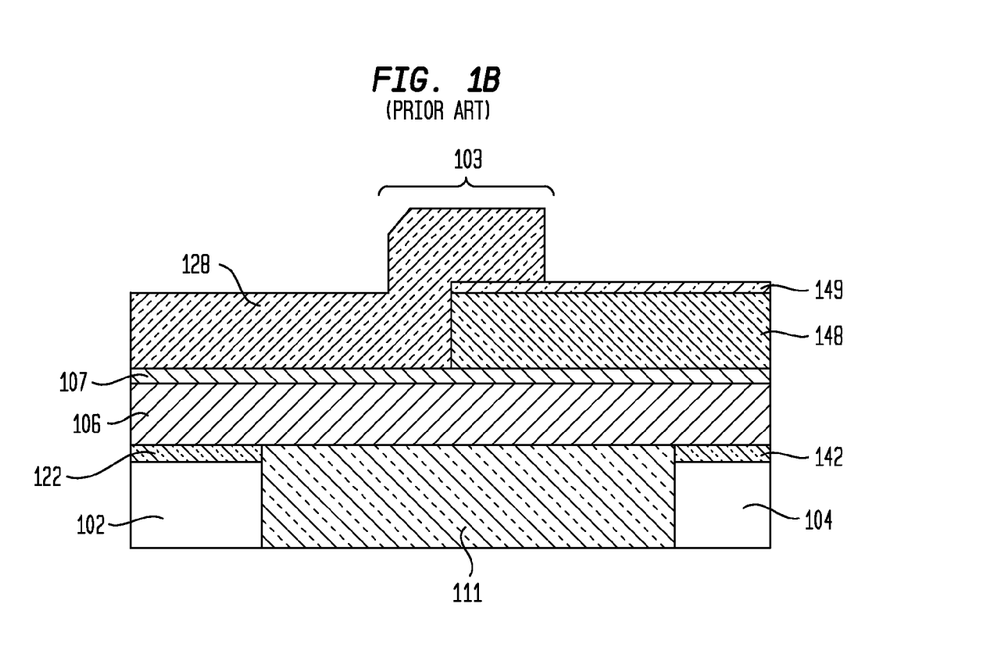
FIG. 1B is a cross-sectional view of the conventional CMOS device of FIG. 1A along line A-A.

FIG. 1A shows a top view of a conventional CMOS device that comprises a p-FET and an n-FET, and FIG. 1B shows a cross-sectional view of the conventional CMOS device through line A-A. Specifically, such a conventional CMOS device comprises a p-FET active region 102 and an n-FET active region 104 that are separated from each other by an isolation region 111. A common gate structure that comprises a patterned gate conductor 106 and a gate metal silicide layer 107 extend over both active regions 102 and 104 and across the isolation region 111. Gate dielectrics 122 and 142 respectively isolate the p-FET active region 102 and the n-FET active region 104 from the patterned gate conductor 106.

On one hand, a compressively stressed silicon nitride layer 128 selective overlays the p-FET active region 102, but not the n-FET active region 104. On the other hand, a tensilely stressed silicon nitride layer 148 selectively overlays the n-FET active region 104, but not the p-FET active region 102. An optional etch stop layer 149, which preferably comprises a low temperature oxide (LTO), is provided over the tensilely stressed silicon nitride layer 148. As shown in FIG. 1B, the compressively and tensilely stressed silicon nitride layers 128 and 148 are not perfectly aligned at their edges but overlap significantly at the boundary region 103. The misalignment between the compressively and tensilely stressed silicon nitride layers 128 and 148 may also form a gap (not shown) at the boundary region 103.

In the incident that the tensilely and compressively stressed dielectric layers overlap, as shown hereinabove in FIG. 1B, the boundary region has a dielectric layer thickness that is twice of the thickness of the dielectric layer in other regions, which may cause insufficient contact etch. Specifically, if a metal contact is formed over the boundary region, such a metal contact may not be able to extend through the thick dielectric layer located on the boundary region and therefore fails to make contact to the underlying FET components (e.g., the gate conductors or the source/drain of the FETs).

In the alternative incident that a gap is formed between the tensilely and compressively stressed dielectric layers, the etching process used for forming the metal contact opening through the tensilely or compressively stressed dielectric layer may punch through the FET components that are exposed through the gap between the tensilely and compressively stressed dielectric layers. Further, the gap may allow sodium and other contaminants to diffuse into the exposed FET components and thereby causes degradation of the device performance.

SUMMARY OF THE INVENTION

The present invention advantageously overcomes the above-mentioned drawbacks of the conventional CMOS device that comprises dual stressor layers of tensile and compressive stresses, by first creating a gap between the tensile and compressive stressor layers and then filling the gap with a dielectric filler material. In this manner, any overlap between the tensilely and compressively stressed dielectric layers can be effectively avoided, while the risk of contamination typically associated with gapped dual stressor layers can be minimized or completely eliminated.

In one aspect, the present invention relates to a semiconductor device comprising:

at least one n-channel field effect transistor (n-FET) and at least one p-channel field effect transistor (p-FET) that are spaced apart from each other;

a tensilely stressed dielectric layer overlaying the at least one n-FET; and a compressively stressed dielectric layer overlaying the at least one p-FET, wherein a gap is located between the tensilely and compressively stressed dielectric layers, and wherein said gap is filled with a dielectric filler material that is different from the tensilely and compressively stressed dielectric layers.

The dielectric filler material may differ from the tensilely and compressively stressed dielectric layers in any physical or compositional characteristic, such as, for example, density, etching rate, stress, oxygen or nitrogen content, etc. Preferably, but not necessarily, the dielectric filler material comprises different stress from the tensilely and compressively stressed dielectric layers. More preferably, the dielectric filler material is essentially free of stress.

The gap preferably has a width ranging from about 1 nm to about 100 nm. More preferably, the gap width ranges from about 5 nm to about 80 nm, and most preferably from about 30 nm to about 50 nm.

In a specific embodiment of the present invention, the dielectric filler material is essentially free of stress, and both the tensilely and compressively stressed dielectric layers are covered by a layer of the dielectric filler material. In an alternative embodiment of the present invention, the dielectric filler material is present only in the gap between the tensilely and compressively stressed dielectric layers.

The tensilely and compressively stressed dielectric layers and the dielectric filler material may comprise any suitable dielectric materials with the corresponding stress profiles. Preferably, but not necessarily, the tensilely stressed dielectric layer comprises tensilely stressed silicon nitride, the compressively stressed dielectric layer comprises compressively stressed silicon nitride, and the dielectric filler material comprises silicon nitride that is different from such tensilely and compressively silicon nitrides.

The n-FET and the p-FET as described hereinabove may comprise a common gate structure that is located under both the tensilely and compressively stressed dielectric layers, or they may comprise separate gate structures that are isolated from each other and are respectively located under the tensilely and compressively stressed dielectric layers.

In another aspect, the present invention relates to a method for forming a semiconductor device comprising:

forming at least one n-channel field effect transistor (n-FET) and at least one p-channel field effect transistor (p-FET) that are spaced apart from each other;

forming a tensilely stressed dielectric layer over both the n-FET and the p-FET;

selectively removing a portion of the tensilely stressed dielectric layer from the p-FET, wherein a remaining portion of the tensilely stressed dielectric layer overlays the n-FET;

forming a compressively stressed dielectric layer over both the n-FET and the p-FET;

selectively removing a portion of the compressively stressed dielectric layer from the n-FET, wherein a remaining portion of the compressively stressed dielectric layer overlays the p-FET, and wherein a gap is located between the remaining portion of the compressively stressed dielectric layer and the remaining portion of the tensilely stressed dielectric layer; and filling the gap with a dielectric filler material.

The dielectric filler material used for filling the gap in the above-mentioned method can be either the same or different from the materials contained by the tensilely and compressively stressed dielectric layers. Preferably, but not necessarily, the dielectric filler material is different from the tensilely and compressively stressed dielectric layers. More preferably, but not necessarily, the dielectric filler material comprises different stress from the tensilely and compressively stressed dielectric layers.

Preferably, the gap is filled by depositing a layer of the dielectric filler material over the tensilely and compressively stressed dielectric layers and the gap therebetween, and the deposited layer of the dielectric filler material has a layer thickness that is larger than half of the gap width.

In a still further aspect, the present invention relates to a method for forming a semiconductor device comprising:

forming at least one n-channel field effect transistor (n-FET) and at least one p-channel field effect transistor (p-FET) that are spaced apart from each other;

forming a compressively stressed dielectric layer over both the n-FET and the p-FET;

selectively removing a portion of the compressively stressed dielectric layer from the n-FET, wherein a remaining portion of the compressively stressed dielectric layer overlays the p-FET;

forming a tensilely stressed dielectric layer over both the n-FET and the p-FET;

selectively removing a portion of the tensilely stressed dielectric layer from the p-FET, wherein a remaining portion of the tensilely stressed dielectric layer overlays the n-PET, and wherein a gap is located between the remaining portion of the tensilely stressed dielectric layer and the remaining portion of the compressively stressed dielectric layer; and filling the gap with a dielectric filler material.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The term "essentially free of stress" as used herein refers to a structure or a material containing tensile or compressive stress that is less than about 400 MPa.

The present invention provides an improved CMOS device that comprises at least one n-FET and at least one p-FET with dual stressor layers located thereon, i.e., a tensile stressor layer is located over the at least one n-FET and a compressive stressor layer is located over the at least one p-FET. A gap is first formed between the tensile and compressive stressor layers and is then filled with a dielectric filler material. Such a gap with dielectric filler material functions to avoid formation of any overlap between the tensilely and compressively stressed dielectric layers, while concurrently minimizing or completely eliminating the risk of contamination typically associated with gapped dual stressor layers.

Figure 2A:
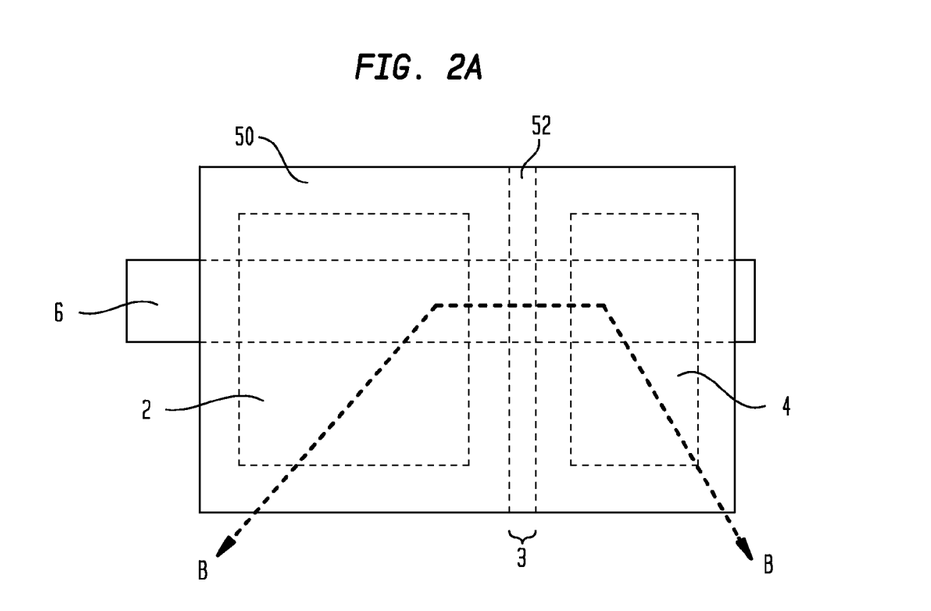
FIG. 2A is a top view of an improved CMOS device comprising an n-FET and a p-FET with a common gate structure and gapped tensile and compressive stressor layers, while a dielectric filler material layer that is essentially free of stress overlays both the tensile and compressive stressor layers and fills the gap therebetween, according to one embodiment of the present invention.
Figure 2B:
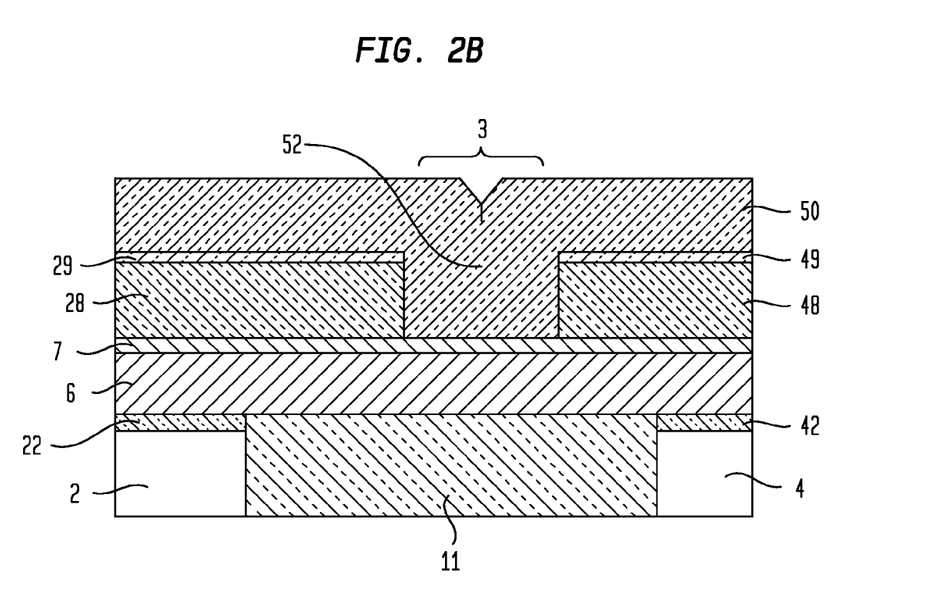
FIG. 2B is a cross-sectional view of the improved CMOS device of FIG. 2A along line B-B.

FIGS. 2A and 2B respectively show the top view and cross-sectional view of an improved CMOS device, according to one embodiment of the present invention.

Specifically, the CMOS device comprises a p-FET that is located over a p-FET active region 2 and an n-FET that is located over an n-FET active region 4. The p-FET active region 2 and the n-FET active region 4 are located in the same semiconductor substrate (not shown) and are separated from each other by an isolation region 11. A common gate structure that comprises a patterned gate conductor 6 and a gate metal silicide layer 7 extend over both active regions 2 and 4 and across the isolation region 11. Gate dielectrics 22 and 42 respectively isolate the p-FET active region 2 and the n-FET active region 4 from the patterned gate conductor 6.

A compressively stressed dielectric layer 28 selective overlays the p-FET active region 2, but not the n-FET active region 4, while a tensilely stressed silicon nitride layer 48 selectively overlays the n-FET active region 4, but not the p-FET active region 2. Optional etch stop layers 29 and 49 are respectively provided over the compressively and tensilely stressed dielectric layers 28 and 48.

The compressively and tensilely stressed dielectric layers 28 and 48 do not overlap in any manner. Instead, a gap 3 is present between the compressively and tensilely stressed dielectric layers 28 and 48, as shown in FIG. 2B. A gap filler 52, which is formed of a dielectric filler material, is provided in the gap 3 between the compressively and tensilely stressed dielectric layers 28 and 48. Because the n-FET and the p-FET active regions 2 and 4 share a common gate structure across the isolation region 1, the gap filler 52 is located directly over the common gate structure, instead of directly on the isolation region 11.

The dielectric filler material that forms the gap filler 52 may comprise any conformal dielectric material that can be used to fill the gap 3. Preferably, but not necessarily, the dielectric filler material is selected from the group consisting of oxides, nitrides, and oxynitrides. More preferably, the dielectric filler material comprises silicon nitride.

The dielectric filler material is deposited by a subsequent process after formation of the tensilely and compressively stressed dielectric layers 28 and 48. The dielectric filler material may differ from the tensilely and compressively stressed dielectric layers 28 and 48 in one or more detectable physical or compositional characteristics such as, for example, density, etching rate, stress, and oxygen or nitrogen content. Alternatively, the dielectric filler material can comprise the same material as that contained by one of the tensilely and compressively stressed dielectric layers 28 and 48, but it is distinguishable from the tensilely or compressively stressed dielectric layer 28 or 48 by an interfacial layer formed at the beginning of the subsequent deposition process.

Preferably, but not necessarily, the dielectric filler material comprises either tensile or compressive stress that is quantitatively different from that contained by the tensilely or compressively stressed dielectric layer 28 or 48. More preferably, the dielectric filler material is essentially free of stress, i.e., it is stress-neutral.

In the specific embodiment shown by FIGS. 2A and 2B, the dielectric filler material that forms the gap filler 52 also forms a layer 50 that extends outside of the gap 3 to cover the compressively and tensilely stressed dielectric layers 28 and 48. In this specific embodiment, it is particularly preferred that the dielectric filler material is stress-neutral, so that the layer 50 does not offset the desired stress provided by the underlying stressor layers 28 and 48.

The gap 3 between the compressively and tensilely stressed dielectric layers 28 and 48 preferably has a gap width that ranges from about 1 nm to about 100 nm, more preferably from about 5 nm to about 80 nm, and most preferably from about 30 nm to about 50 nm.

Further, the dielectric filler material layer 50 preferably has a layer thickness that is more than half of the gap width. For example, when the gap width ranges from about 30 nm to about 50 nm, the layer thickness of the dielectric filler material layer 50 preferably ranges from about 20 nm to about 30 nm.

Although FIGS. 2A and 2B shows a specific embodiment of the present invention in which excess dielectric filler material also forms a layer 50 extending outside of the gap 3 to cover the compressively and tensilely stressed dielectric layers 28 and 48, the present invention also contemplates the alternative embodiment in which the excess dielectric filler material is removed from over the compressively and tensilely stressed dielectric layers 28 and 48, so that only the portion of the dielectric filler material that forms the gap filler 52 in the gap 3 remains in the final CMOS device.

Figure 3A:
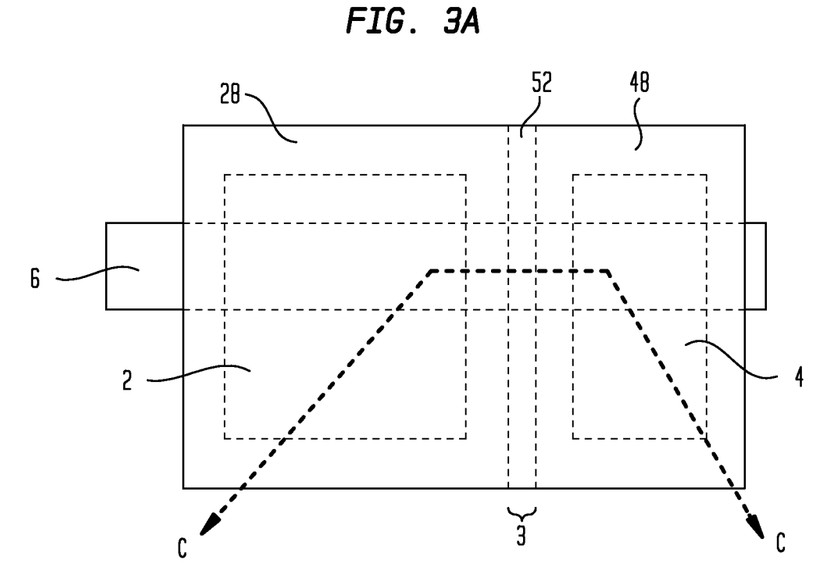
FIG. 3A is a top view of an improved CMOS device comprising an n-FET and a p-FET with a common gate structure and gapped tensile and compressive stressor layers, while a dielectric filler material fills the gap between the tensile and compressive stressor layers, according to one embodiment of the present invention.
Figure 3B:
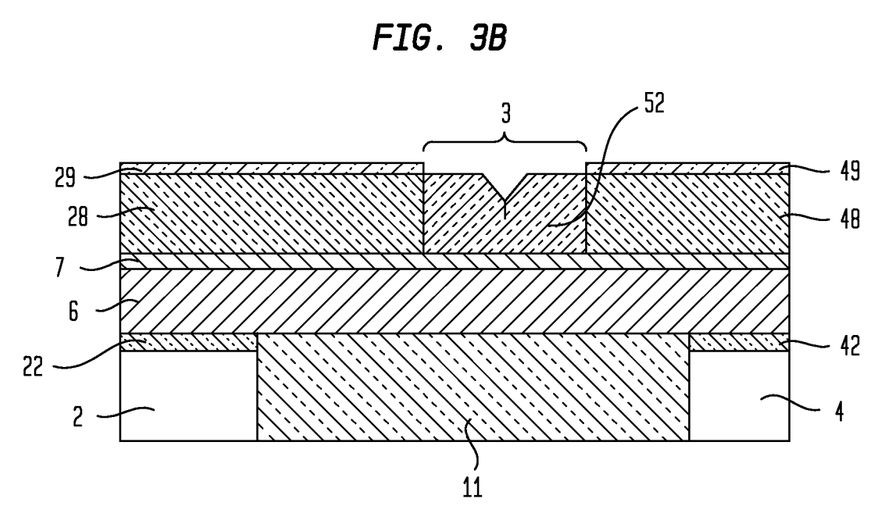
FIG. 3B is a cross-sectional view of the improved CMOS device of FIG. 3A along line C-C.

FIGS. 3A and 3B therefore show the top view and cross-sectional view of an improved CMOS device that is similar to that shown in FIGS. 2A and 2B, except that the layer 50 formed of excess dielectric filler material has been removed from above the compressively and tensilely stressed dielectric layers 28 and 48.

Correspondingly, only a portion of the dielectric filler material that forms the gap filler 52 is present in the gap 3 between the compressively and tensilely stressed dielectric layers 28 and 48. The optional etch stop layers 29 and 49 located over the compressively and tensilely stressed dielectric layers 28 and 48 become exposed. Alternatively, if no etch stop layer is provided, the compressively and tensilely stressed dielectric layers 28 and 48 themselves will become exposed.

The n-FET and p-FET of the present invention may share a common gate structure, as shown hereinabove by FIGS. 2A-3B, but they may also comprise separate gate structures that are isolated from each other.

Figure 4A:
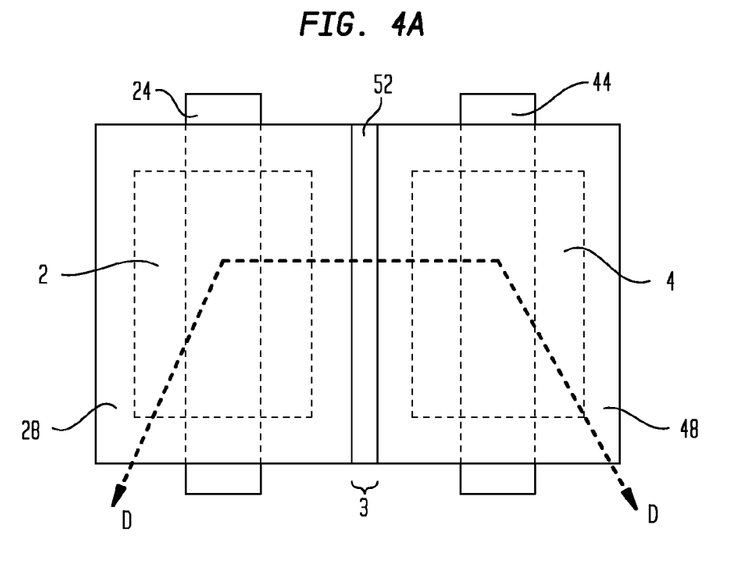
FIG. 4A is a top view of an improved CMOS device comprising an n-FET and a p-FET with separate gate structures and gapped tensile and compressive stressor layers, while a dielectric filler material fills the gap between the tensile and compressive stressor layers, according to one embodiment of the present invention.
Figure 4B:
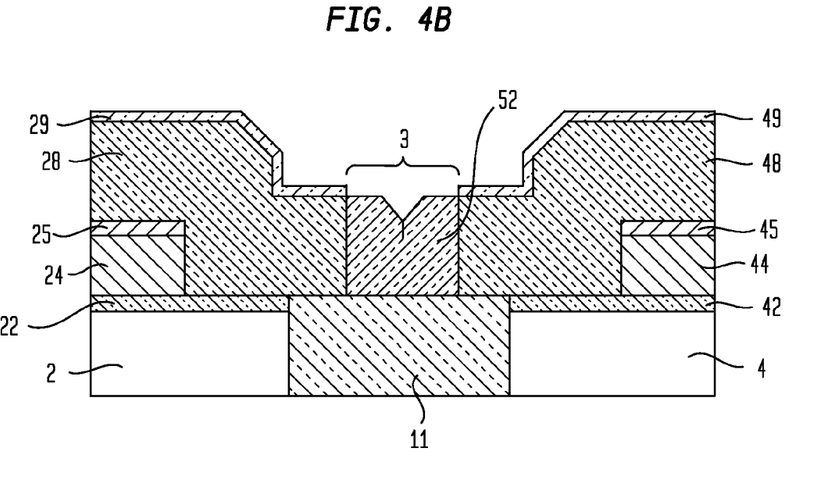
FIG. 4B is a cross-sectional view of the improved CMOS device of FIG. 4A along line D-D.

FIGS. 4A and 4B show the top view and cross-sectional view of an improved CMOS device that is similar to that shown in FIGS. 3A and 3B, except that separate gate structures, one of which comprises a first gate conductor 24 and a first gate metal silicide 25 and the other of which comprises a second gate conductor 44 and a second gate metal silicide 45, are provided over the p-FET active region 2 and the n-FET active region 4, respectively. In this specific embodiment, the gap filler 52 is no longer located over a common gate structure (as shown hereinabove in FIGS. 2A-3B), but is instead located directly on the isolation region 11, as shown in FIG. 4B.

The CMOS device structures as illustrated hereinabove can be readily formed by well known lithographic, etching, and dielectric deposition techniques. The CMOS devices can also be formed utilizing a conventional replacement gate process. Exemplary processing steps that can be used for forming the CMOS device structure of FIGS. 2A-2B or FIGS. 3A-3B will now be described in greater detail by referring to the accompanying drawings in FIGS. 5-10. Note that in these drawings, which are not drawn to scale, like and/or corresponding elements are referred to by like reference numerals. It is further noted that in the drawings only one n-FET and one p-FET are shown. Although illustration is made to such an embodiment, the present invention is not limited to the formation of any specific number of n- and/or p-FET devices.

Figure 5:
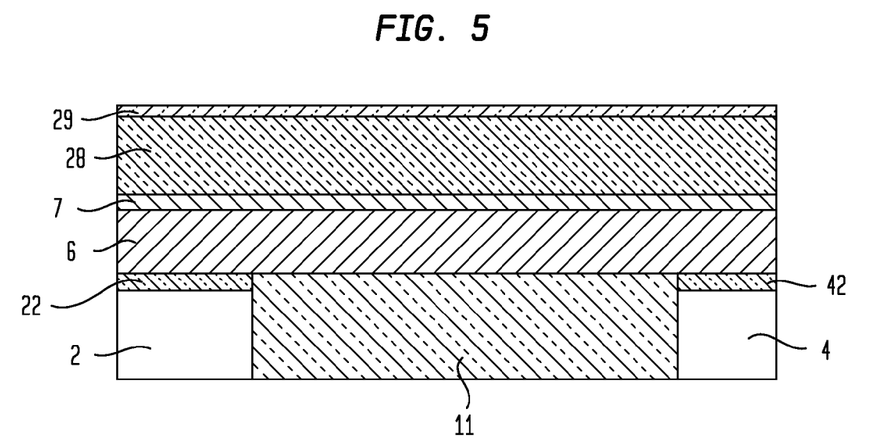
FIGS. 5-10 are cross-sectional views that illustrate exemplary processing steps for forming the improved CMOS device of FIGS. 2A-2B or FIGS. 3A-3B, according to one embodiment of the present invention.

Reference is first made to FIG. 5, which shows formation of a blanket compressively stressed dielectric layer 28 over a common gate structure that comprises a patterned gate conductor 6 and a gate metal silicide layer 7. The common gate structure is in turn located over a p-FET active region 2 and an n-FET active region 4 that are located in the same semiconductor substrate (not shown) and are isolated from each other by the isolation region 11.

The semiconductor substrate (not shown), in which the p-FET active region 2 and the n-FET active region 4 are located, may comprise any semiconductor material including, but not limited to: Si, SiC, SiGe, SiGeC, Ge alloys, GaAs, InAs, InP, as well as other III-V or II-VI compound semiconductors. The semiconductor substrate (not shown) may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate (not shown) be composed of a Si-containing semiconductor material, i.e., a semiconductor material that includes silicon. The semiconductor substrate (not shown) may be doped, undoped or contain doped and undoped regions therein. The p-FET active region 2 may be formed of a first doped (n- or p-) region in the semiconductor substrate (not shown), while the n-FET active region 4 may be formed of a second doped (n- or p-) region. Further, the p-FET and n-FET active regions 2 and 4 may have the same or different conductivities and/or doping concentrations.

The isolation region 11 is typically formed into the semiconductor substrate (not shown) to provide isolation between the p-FET and n-FET active regions 2 and 4. The isolation region 11 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process.

After forming the at least one isolation region 11 within the semiconductor substrate (not shown), a blanket gate dielectric layer (not shown) may be deposited over the entire surface of the semiconductor structure (not shown). Alternatively, patterned gate dielectric layers 22 and 42 are formed respectively over the p-FET active region 2 and the n-FET active region 4, as shown in FIG. 5. The gate dielectric layers 22 and 42 can be formed by a thermal growing process such as, for example, oxidation, nitridation or oxynitridation. Alternatively, the gate dielectric layers 22 and 42 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric layers 22 and 42 may also be formed utilizing any combination of the above processes.

The gate dielectric layers 22 and 42 may be comprised of any suitable insulating material, which includes, but is not limited to: an oxide, nitride, oxynitride and/or silicate including metal silicates and nitrided metal silicates. In one embodiment, it is preferred that the gate dielectric layers 22 and 42 are comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric layers 22 and 42 may vary, but typically, the gate dielectric layers 22 and 42 each has a thickness from about 0.5 to about 10 nm, with a thickness from about 0.5 to about 3 nm being more typical.

After forming the gate dielectric layers 22 and 42, a common gate conductor 6, which preferably comprises polysilicon, is formed over both the n-FET and p-FET active regions 2 and 4 and across the isolation region 11, utilizing a known deposition process such as, for example, physical vapor deposition, CVD or evaporation, followed by a known gate patterning process, such as lithography and etching. The common gate conductor 6 may be doped or undoped. If doped, an in-situ doping deposition process may be employed in forming the same. Alternatively, a doped polysilicon gate conductor 6 can be formed by deposition, ion implantation and annealing. The thickness, i.e., height, of the common gate conductor 6 may vary depending on the deposition process employed. Typically, the common gate conductor 6 has a vertical thickness from about 20 to about 180 nm, with a thickness from about 40 to about 150 nm being more typical.

Optionally, but not necessarily, a metal silicide layer 7 is formed over the gate conductor 6 by a known salicidation process, which is not described in detail here in order to avoid obscure the present invention.

The gate conductor 6 and the optional gate metal silicide layer 7 jointly form a common gate structure that extends over both the p-FET and n-FET active regions 2 and 4 and across the isolation region 11. The common gate structure may comprise additional structures, e.g., sidewall spacers, cap layers and/or diffusion barrier layers (not shown), as commonly included in MOS gate structures. In a preferred embodiment of the present invention, no sidewall spacer is present in the gate structure, so that the device footprint can be reduced and the distance between adjacent device regions can be increased to facilitate the subsequent gap filling.

After formation of the common gate structure, a compressively stressed dielectric layer 28, which preferably, but not necessarily, comprises compressively stressed silicon nitride, is deposited over the entire structure to cover both the p-FET active region 2 and the n-FET active region 4. The compressively stressed silicon nitride layer 28 can be formed by, for example, a plasma enhanced chemical vapor deposition (PECVD) process, as disclosed by U.S. Patent Application Publication No. 2003/0040158 or by A. Tarraf et al., "Stress Investigation of PECVD Dielectric Layers for Advanced Optical MEMS," J. MICROMECH. MICROENG., Vol. 14, pp. 317-323 (2004), or by any other suitable deposition techniques well known in the art. Preferably, the compressively stressed silicon nitride layer 28 has a thickness ranging from about 10 nm to about 1000 nm, more preferably from about 20 nm to about 500 nm, and most preferably from about 30 nm to about 150 nm.

An optional etch stop layer 29, which preferably, but not necessarily, comprises a low temperature oxide (LTO), can then be formed over the compressively stressed dielectric layer 28. The LTO etch stop layer 29 may be formed by a known low temperature oxidation process that is typically carried out at a processing temperature ranging from about 300° C. to about 450° C.

Figure 6:
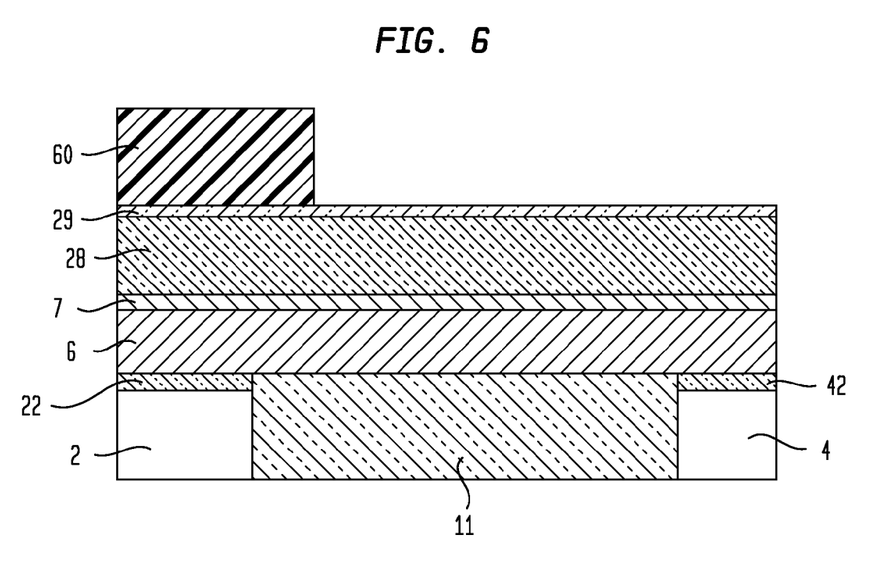

Subsequently, a first block mask 60 is deposited over the compressively stressed dielectric layer 28 and the optional etch stop layer 29 to cover only the portions of such layers that are located directly above the p-FET active region 2, while the remaining portions of layers 28 and 29 located above the n-FET active region 4 are exposed, as shown in FIG. 6.

Figure 7:
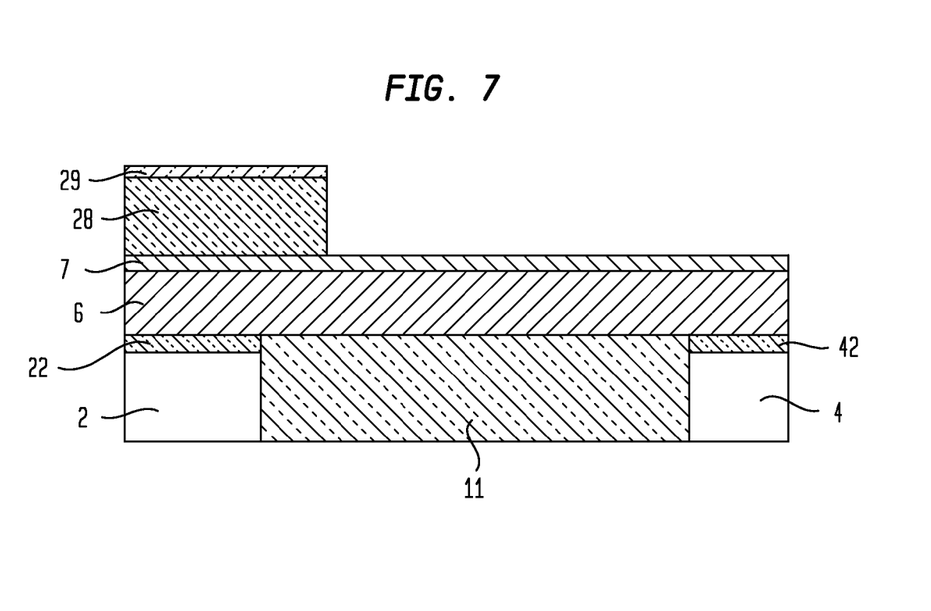

A first selective etching step is then carried out using the first block mask 60 to selectively remove the exposed portions of layers 28 and 29 from above the n-FET active region 4, as shown in FIG. 7. One or more dry etching techniques, which include, but are not limited to: reactive ion etching (RIE), ion beam etching, plasma etching or laser ablation, can be used to selectively removed the exposed portions of layers 28 and 29. The first block mask 60 is removed after the first selective etching step has been completed.

Figure 8:
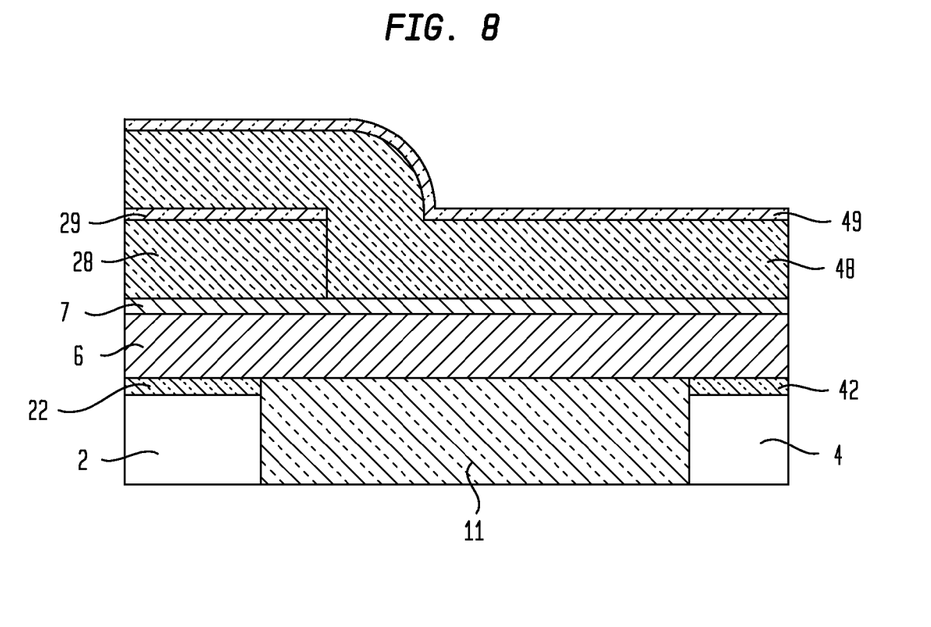

Next, a tensilely stressed dielectric layer 48, which preferably, but not necessarily, comprises tensilely stressed silicon nitride, is deposited over the entire structure to cover both the p-FET active region 2 and the n-FET active region 4. The tensilely stressed dielectric layer 48 specifically overlays the un-removed portions of the compressive stressor layer 28 and the etch stop layer 29, as shown in FIG. 8. The tensilely stressed silicon nitride layer 48 can also be formed by the plasma enhanced chemical vapor deposition (PECVD) process disclosed by U.S. Patent Application Publication No. 2003/0040158 or by A. Tarraf et al., "Stress Investigation of PECVD Dielectric Layers for Advanced Optical MEMS," J. MICROMECH. MICROENG., Vol. 14, pp. 317-323 (2004), or by any other suitable deposition techniques well known in the art. Preferably, the tensilely stressed silicon nitride layer 48 has a thickness ranging from about 10 nm to about 1000 nm, more preferably from about 20 nm to about 500 nm, and most preferably from about 30 nm to about 150 nm. An optional etch stop layer 49, which preferably, but not necessarily, comprises a LTO, can also be formed over the tensilely stressed dielectric layer 48.

Figure 9:
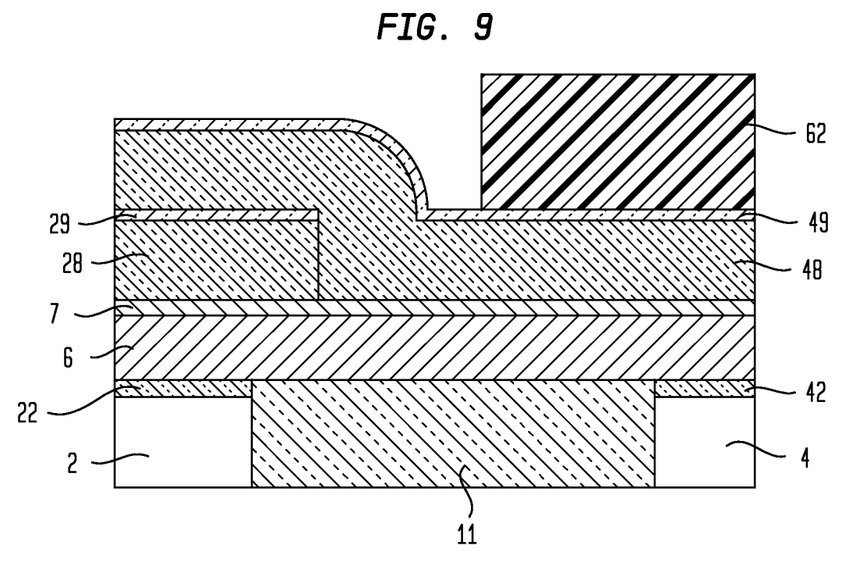

A second block mask 62 is deposited over the tensilely stressed dielectric layer 48 and the optional etch stop layer 49 to cover only the portions of such layers that are located directly above the n-FET active region 4, while the remaining portions of layers 48 and 49 located above the p-FET active region 2 are exposed, as shown in FIG. 9.

Figure 10:
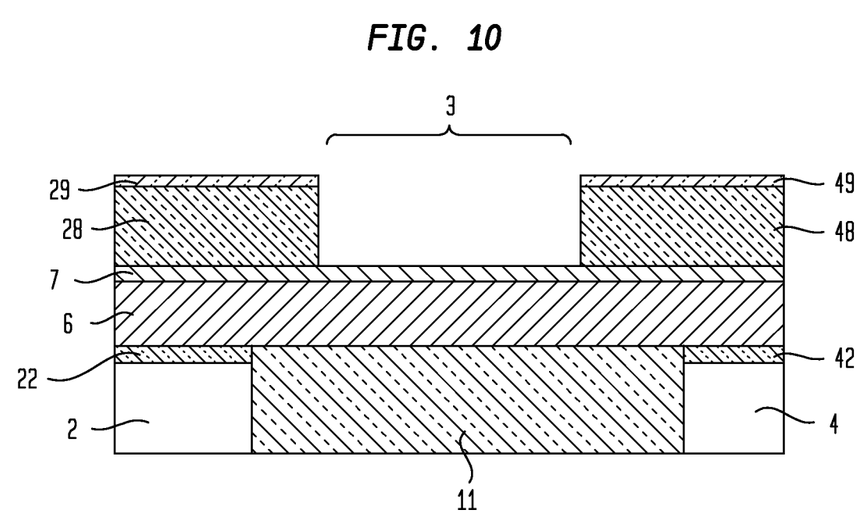

More importantly, the second block mask 62 are constructed and arranged so that it does not overlap with the un-removed portions of the compressive stressor layer 28 and the etch stop layer 29, as shown in FIG. 9. Instead, the second block mask 62 is laterally offset from the un-removed portions of the compressive stressor layer 28 and the etch stop layer 29 by a significantly distance. In this manner, a second selective etching step can be carried out to remove un-masked portions of the tensilely stressed dielectric layer 48 and the optional etch stop layer 49 from above the p-FET active region 2 and form a gap 3 between the remaining portions of the tensilely stressed dielectric layer 48 and the compressively stressed dielectric layer 28, as shown in FIG. 10.

After the second selective etching step, the second block mask 62 is removed from above the n-FET active region 4, and a layer of a dielectric filler material 50 is deposited over the entire structure. The dielectric filler material layer 50 not only covers the compressively stressed dielectric layer 28 and the tensilely stressed dielectric layer 48, but also forms a gap filler 52 in the gap 3 between the compressively stressed dielectric layer 28 and the tensilely stressed dielectric layer 48, as shown in FIG. 2B.

Further, an etch-back step can be carried out to remove excess dielectric filler material from above the compressively stressed dielectric layer 28 and the tensilely stressed dielectric layer 48, while leaving only the gap filler 52 in the gap 3 between the compressively stressed dielectric layer 28 and the tensilely stressed dielectric layer 48, as shown in FIG. 3B. The etch-back step can also be terminated prematurely, so as to leave a significantly thinned dielectric filler material layer (not shown) over the compressively stressed dielectric layer 28 and the tensilely stressed dielectric layer 48.

Subsequently, conventional back-end-of-line processing steps, which are not described herein in detail, can be carried out to form a complete CMOS device containing both a p-FET and an n-FET.

It should be noted that although the above-described processing steps illustrate formation and patterning of the compressively stressed dielectric layer 28 before the tensilely stressed dielectric layer 48, the present invention is not limited to such a specific order. In other words, the tensilely stressed dielectric layer 48 can be readily formed and patterned before deposition and patterning of the compressively stressed dielectric layer 28 in the practice of the present invention.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A semiconductor device comprising:
    at least one n-channel field effect transistor (n-FET) and at least one p-channel field effect transistor (p-FET) that are spaced apart from each other;
    a tensilely stressed dielectric layer overlaying the at least one n-FET;
    a compressively stressed dielectric layer overlaying the at least one p-FET,
    wherein a gap is located between the tensilely and compressively stressed dielectric layers, and wherein said gap is filled with a dielectric filler material that is different from the tensilely and compressively stressed dielectric layers and wherein the dielectric filler material is present only in the gap between the tensilely and compressively stressed dielectric layers.

2. The semiconductor device of claim 1, wherein the dielectric filler material comprises different stress from the tensilely and compressively stressed dielectric layers.

3. The semiconductor device of claim 1, wherein the gap has a width ranging from about 1 nm to about 100 nm.

4. The semiconductor device of claim 1, wherein the dielectric filler material is essentially free of stress.

5. The semiconductor device of claim 1, wherein the n-FET and the p-FET comprise a common gate structure that is located under both the tensilely and compressed stressed dielectric layers.

6. The semiconductor device of claim 1, wherein the n-FET and the p-FET comprise separate gate structures that are isolated from each other and are respectively located under the tensilely and compressively stressed dielectric layers.

7. A method for forming a semiconductor device comprising:
   forming at least one n-channel field effect transistor (n-FET) and at least one p-channel field effect transistor (p-FET) that are spaced apart from each other;
   forming a tensilely stressed dielectric layer over both the n-FET and the p-FET
   selectively removing a portion of the tensilely stressed dielectric layer from the p-FET, wherein a remaining portion of the tensilely stressed dielectric layer overlays the n-FET;
   forming a compressively stressed dielectric layer over both the n-FET and the p-FET;
   selectively removing a portion of the compressively stressed dielectric layer from the n-FET, wherein a remaining portion of the compressively stressed dielectric layer overlays the p-FET, and wherein a gap is located between the remaining portion of the compressively stressed dielectric layer and the remaining portion of the tensilely stressed dielectric layer; and
   filling the gap with a dielectric filler material, wherein the filling the gap includes depositing a layer of the dielectric filler material over the tensilely and compressively stressed dielectric layers and the gap therebetween, said deposited layer of the dielectric filler material has a layer thickness that is larger than half of the gap width, and removing excess dielectric filler material from over the tensilely and compressively stressed dielectric layers, so that the dielectric filler material is only present in the gap between the tensilely and compressively stressed dielectric layers.

8. The method of claim 7, wherein the dielectric filler material is different from the tensilely and compressively stressed dielectric layers.

9. The method of claim 7, wherein the dielectric filler material comprises different stress from the tensilely and compressively stressed dielectric layers.

10. The method of claim 7, wherein the gap has a width ranging from about 1 nm to about 100 nm.

* * * * *